United States Patent
Suzuki

(10) Patent No.: US 7,396,766 B2
(45) Date of Patent: Jul. 8, 2008

(54) LOW-TEMPERATURE CHEMICAL VAPOR DEPOSITION OF LOW-RESISTIVITY RUTHENIUM LAYERS

(75) Inventor: Kenji Suzuki, Guilderland, NY (US)

(73) Assignee: Tokyo Electron Limited, Tokyo (JP)

( * ) Notice: Subject to any disclaimer, the term of this patent is extended or adjusted under 35 U.S.C. 154(b) by 372 days.

(21) Appl. No.: 11/095,356

(22) Filed: Mar. 31, 2005

(65) Prior Publication Data

US 2006/0220248 A1 Oct. 5, 2006

(51) Int. Cl.
*H01L 21/443* (2006.01)
(52) U.S. Cl. ........... 438/680; 438/686; 257/E21.584
(58) Field of Classification Search .......... 438/686
See application file for complete search history.

(56) References Cited

U.S. PATENT DOCUMENTS

| | | | |
|---|---|---|---|
| 6,303,809 B1 | 10/2001 | Chi et al. | 556/136 |
| 6,319,832 B1 | 11/2001 | Uhlenbrock et al. | 438/681 |
| 6,440,495 B1 | 8/2002 | Wade et al. | 427/250 |
| 6,605,735 B2 | 8/2003 | Kawano et al. | 556/136 |
| 6,713,373 B1 | 3/2004 | Omstead | 438/608 |
| 7,107,998 B2 * | 9/2006 | Greer et al. | 134/22.1 |
| 2003/0129306 A1 | 7/2003 | Wade et al. | 427/255.28 |
| 2003/0203617 A1 | 10/2003 | Lane et al. | |
| 2004/0013577 A1 | 1/2004 | Ganguli et al. | 422/129 |
| 2004/0105934 A1 | 6/2004 | Chang et al. | 427/255.28 |
| 2004/0241321 A1 | 12/2004 | Ganguli et al. | 427/255.28 |
| 2005/0081882 A1 | 4/2005 | Greer et al. | 134/1.1 |
| 2005/0110142 A1 | 5/2005 | Lane et al. | 257/751 |
| 2005/0186341 A1 | 8/2005 | Hendrix et al. | 427/248.1 |
| 2006/0110530 A1 * | 5/2006 | Suzuki et al. | 427/248.1 |

FOREIGN PATENT DOCUMENTS

| | | |
|---|---|---|
| WO | 2006057706 A2 | 6/2006 |
| WO | 2006057709 A2 | 6/2006 |

OTHER PUBLICATIONS

Wang et al., Low-temperature chemical vapor deposition and scaling limit of ultrathin Ru films, Applied Physics Letters, Feb. 23, 2004, pp. 1380-1382, vol. 84, No. 8, American Institute of Physics, Melville, NY.

European Patent Office, International Search Report and Written Opinion, Aug. 11, 2006, 9 pp.

* cited by examiner

*Primary Examiner*—Stephen W Smoot
(74) *Attorney, Agent, or Firm*—Wood, Herron & Evans, LLP

(57) ABSTRACT

A low-temperature chemical vapor deposition process for depositing of a low-resistivity ruthenium metal layers that can be used as barrier/seed layers in Cu metallization schemes. The method includes providing a substrate in a process chamber of a deposition system, forming a process gas containing a ruthenium carbonyl precursor vapor and a CO-containing gas, and exposing the substrate to the process gas to deposit a low-resistivity ruthenium metal layer on the substrate by a thermal chemical vapor deposition process, where the substrate is maintained at a temperature between about 100° C. and about 300° C. during the exposing. A semiconductor device containing the ruthenium metal layer formed on a patterned substrate containing one or more vias or trenches, or combinations thereof, is provided.

23 Claims, 7 Drawing Sheets

LOW-TEMPERATURE CHEMICAL VAPOR DEPOSITION OF LOW-RESISTIVITY RUTHENIUM LAYERS

CROSS REFERENCE TO RELATED APPLICATIONS

The present invention is related to U.S. patent application Ser. No. 10/996,145, entitled METHOD FOR INCREASING DEPOSITION RATES OF METAL LAYERS FROM METAL-CARBONYL PRECURSORS, the entire contents of which is herein incorporated by reference.

FIELD OF THE INVENTION

The present invention relates to semiconductor processing, and more particularly, to a low-temperature chemical vapor deposition method for forming a low-resistivity ruthenium layer on a substrate.

BACKGROUND OF THE INVENTION

The introduction of copper (Cu) metal into multilayer metallization schemes for manufacturing integrated circuits can necessitate the use of diffusion barriers/liners to promote adhesion and growth of the Cu layers and to prevent diffusion of Cu into the dielectric materials. Barriers/liners that are deposited onto dielectric materials can include refractive materials, such as tungsten (W), molybdenum (Mo), and tantalum (Ta), that are non-reactive and immiscible in Cu, and can offer low electrical resistivity. Current integration schemes that integrate Cu metallization and dielectric materials can require that barrier/liner deposition processes be conducted at low temperatures, for example below about 300° C. When integrating barrier/liners layers with temperature sensitive material layers, such as various low-dielectric constant (low-k) materials, even lower substrate temperatures may be required, for example substrate temperatures between about 100° C. and about 300° C.

For example, Cu integration schemes for technology nodes less than or equal to about 100 nm can utilize processing that includes patterning a low-k inter-level dielectric, physical vapor deposition (PVD) of a Ta or TaN/Ta barrier layer onto the patterned the low-k dielectric, PVD of a Cu seed layer onto the barrier layer, and electrochemical deposition (ECD) of Cu onto the Cu seed layer. Generally, Ta layers are chosen for their adhesion properties (i.e., their ability to adhere on low-k films), and Ta/TaN layers are generally chosen for their barrier properties (i.e., their ability to prevent Cu diffusion into the low-k film).

Significant efforts have been devoted to the study and implementation of thin transition metal layers as Cu diffusion barriers, including chromium, tantalum, molybdenum and tungsten that exhibit low miscibility in Cu. More recently, other metals, such as ruthenium (Ru) and rhodium (Rh), have been identified as potential barrier layers since they are expected to behave similarly to conventional refractory metals. In addition, it is possible that the use of Ru or Rh can permit the use of only one barrier layer, as opposed to two layers, such as Ta/TaN. For example, it is possible that one Ru layer can replace the Ta/TaN barrier layer. Moreover, current research is finding that the one Ru layer can possibly further replace the Cu seed layer, and bulk Cu deposition can proceed directly following deposition of a Ru barrier/seed layer.

Conventionally, Ru layers can be formed by thermally decomposing a ruthenium-containing precursor, such as a ruthenium carbonyl precursor or a ruthenium organometallic precursor, in a thermal chemical vapor deposition (TCVD) process. However, material properties of Ru layers that are deposited by TCVD can be poor, for example have high electrical resistivity, unless the substrate temperatures are sufficiently high, for example above about 300° C. In addition, the use of a ruthenium carbonyl precursor can lead to poor ruthenium deposition rates due to the low vapor pressure of the ruthenium carbonyl precursor and the transport issues associated therewith. Overall, the inventors have observed that current ruthenium deposition methods suffer from low deposition rates and require high deposition temperatures, thereby making the deposition of ruthenium layers impractical for many semiconductor device applications. In addition, control over the degree of crystallinity, including crystallographic orientation of the deposited ruthenium metal layers, can be required since the stress, the morphology, and electrical resistivity can be a function of the crystallographic orientation.

SUMMARY OF THE INVENTION

The present invention provides a low-temperature chemical vapor deposition method for depositing a low electrical resistivity ruthenium metal layer on a substrate. The ruthenium metal layer can be used as a barrier/seed layer in Cu metallization schemes, where the substrate can be a patterned substrate containing one or more vias or trenches, or combinations thereof.

According to an embodiment of the invention, the method includes providing a substrate in a process chamber of a deposition system, forming a process gas containing $Ru_3(CO)_{12}$ precursor vapor and a CO-containing gas, and exposing the substrate to the process gas to deposit a low electrical resistivity ruthenium metal layer on the substrate by a thermal chemical vapor deposition process, wherein the substrate is maintained at a temperature between about 100° C. and about 300° C. during the exposing.

According to an embodiment of the invention, a semiconductor device is provided. The semiconductor device contains a patterned substrate containing one or more vias or trenches, or combinations thereof, and a ruthenium metal layer having an electrical resistivity of about 8-40 microohm-cm formed on the substrate, where the ruthenium metal layer is deposited by exposing the substrate to a process gas containing a $Ru_3(CO)_{12}$ precursor vapor and a CO-containing gas to deposit the ruthenium metal layer on the substrate by a thermal chemical vapor deposition process, wherein the substrate is maintained at a temperature between about 100° C. and about 300° C. during the exposing.

DETAILED DESCRIPTION OF SEVERAL EMBODIMENTS

In the following description, in order to facilitate a thorough understanding of the invention and for purposes of explanation and not limitation, specific details are set forth, such as a particular geometry of the deposition system and descriptions of various components. However, it should be understood that the invention may be practiced in other embodiments that depart from these specific details.

Figure 1:
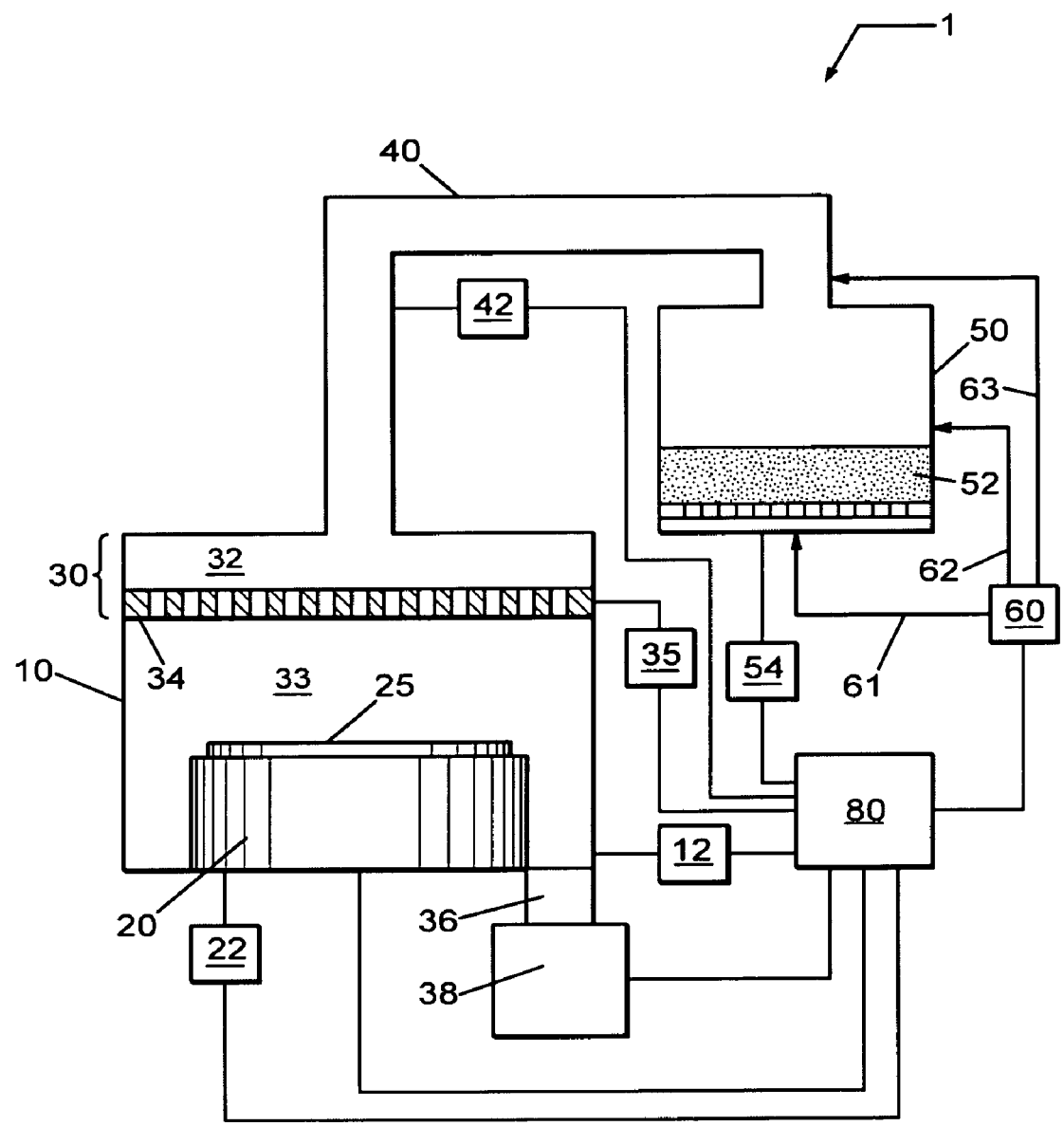
FIG. 1 depicts a schematic view of a deposition system according to an embodiment of the invention.

Referring now to the drawings, wherein like reference numerals designate identical or corresponding parts throughout the several views, FIG. 1 illustrates a deposition system 1 for depositing a ruthenium metal layer on a substrate from a ruthenium carbonyl precursor according to one embodiment of the invention. The deposition system 1 comprises a process chamber 10 having a substrate holder 20 configured to support a substrate 25 upon which the ruthenium metal layer is formed. The process chamber 10 is coupled to a metal precursor vaporization system 50 via a vapor precursor delivery system 40.

The process chamber 10 is further coupled to a vacuum pumping system 38 through a duct 36, wherein the pumping system 38 is configured to evacuate the process chamber 10, vapor precursor delivery system 40, and metal precursor vaporization system 50 to a pressure suitable for forming the ruthenium metal layer on the substrate 25, and suitable for vaporization of the ruthenium carbonyl precursor 52 in the metal precursor vaporization system 50.

Still referring to FIG. 1, the metal precursor vaporization system 50 is configured to store a ruthenium carbonyl precursor 52, and to heat the ruthenium carbonyl precursor 52 to a temperature sufficient for vaporizing the ruthenium carbonyl precursor 52, and to introduce ruthenium carbonyl precursor vapor to the vapor precursor delivery system 40. The ruthenium carbonyl precursor 52 can be solid under the selected heating conditions in the metal precursor vaporization system 50. Alternately, the ruthenium carbonyl precursor 52 can be a liquid. Below, using a solid metal carbonyl precursor 52 is described, however, those skilled in the art will appreciate that ruthenium carbonyl precursors that are liquids under the selected heating conditions can be used without departing from the scope of the invention. For instance, the ruthenium carbonyl precursor can be solid $Ru_3(CO)_{12}$.

In order to achieve the desired temperature for evaporating the ruthenium carbonyl precursor 52 (or subliming the solid ruthenium carbonyl precursor 52), the metal precursor vaporization system 50 is coupled to a vaporization temperature control system 54 configured to control the vaporization temperature. For instance, the temperature of the ruthenium carbonyl precursor 52 is generally elevated to approximately 40° C. to approximately 45° C. in conventional systems in order to sublime the $Ru_3(CO)_{12}$. At this temperature, the vapor pressure of the $Ru_3(CO)_{12}$, for instance, ranges from approximately 1 to approximately 3 mTorr. As the ruthenium carbonyl precursor 52 is heated to cause evaporation (or sublimation), a CO-containing gas can be passed over or through the ruthenium carbonyl precursor 52, or any combination thereof. The CO-containing gas can contain CO and an inert gas, such as $N_2$ or a noble gas (i.e., He, Ne, Ar, Kr, or Xe), or a combination of two or more thereof.

For example, a gas supply system 60 is coupled to the metal precursor vaporization system 50, and it is configured to, for instance, supply CO, a carrier gas, or a mixture thereof, beneath the ruthenium carbonyl precursor 52 via feed line 61, or over the ruthenium carbonyl precursor 52 via feed line 62. In addition, or in the alternative, the gas supply system 60 is coupled to the vapor precursor delivery system 40 downstream from the metal precursor vaporization system 50 to supply the gas to the vapor of the ruthenium carbonyl precursor 52 via feed line 63 as or after it enters the vapor precursor delivery system 40. Although not shown, the gas supply system 60 can comprise a carrier gas source, a CO gas source, one or more control valves, one or more filters, and a mass flow controller. For instance, the flow rate of the CO-containing gas can be between about 0.1 standard cubic centimeters per minute (sccm) and about 1000 sccm. Alternately, the flow rate of the CO-containing gas can be between about 10 sccm and about 300 sccm. Still alternately, the flow rate of the CO-containing gas can be between about 50 sccm and about 200 sccm. According to embodiments of the invention, the flow rate of the CO gas can range from approximately 0.1 sccm to approximately 1000 sccm. Alternately, the flow rate of the CO gas can be between about 1 sccm and about 100 sccm.

Downstream from the metal precursor vaporization system 50, the process gas containing the ruthenium carbonyl precursor vapor flows through the vapor precursor delivery system 40 until it enters the process chamber 10 via a vapor distribution system 30 coupled thereto. The vapor precursor delivery system 40 can be coupled to a vapor line temperature control system 42 in order to control the vapor line temperature and prevent decomposition of the ruthenium carbonyl precursor vapor as well as condensation of the ruthenium carbonyl precursor vapor.

Referring again to FIG. 1, the vapor distribution system 30, which forms part of and is coupled to the process chamber 10, comprises a vapor distribution plenum 32 within which the vapor disperses prior to passing through a vapor distribution plate 34 and entering a processing zone 33 above substrate 25. In addition, the vapor distribution plate 34 can be coupled to a distribution plate temperature control system 35 configured to control the temperature of the vapor distribution plate 34.

Once the process gas containing the ruthenium carbonyl precursor vapor enters the processing zone 33 of process chamber 10, the ruthenium carbonyl precursor vapor thermally decomposes upon adsorption at the substrate surface due to the elevated temperature of the substrate 25, and a metal layer is formed on the substrate 25. The substrate holder 20 is configured to elevate the temperature of the substrate 25 by virtue of the substrate holder 20 being coupled to a substrate temperature control system 22. For example, the substrate temperature control system 22 can be configured to elevate the temperature of the substrate 25 up to approximately 500° C. Additionally, the process chamber 10 can be coupled to a chamber temperature control system 12 configured to control the temperature of the chamber walls.

As described above, for example, conventional systems have contemplated operating the metal precursor vaporization system 50, as well as the vapor precursor delivery system 40, within a temperature range of approximately 40° C. to approximately 45° C. for $Ru_3(CO)_{12}$ in order to prevent decomposition, which occurs at higher temperatures. For example, $Ru_3(CO)_{12}$ can decompose at elevated temperatures to form by-products, such as those illustrated below:

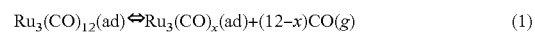

or,

wherein these by-products can adsorb (ad), i.e., condense, on the interior surfaces of the deposition system 1. The accumulation of material on these surfaces can cause problems from one substrate to the next, such as process repeatability. Alternatively, for example, $Ru_3(CO)_{12}$ can condense on the internal surfaces of the deposition system 1, viz.

$$Ru_3(CO)_{12}(g) \Leftrightarrow Ru_3(CO)_{12}(ad) \qquad (3).$$

In summary, low vapor pressure of some ruthenium carbonyl precursors (e.g., $Ru_3(CO)_{12}$) and the small process window, results in very low deposition rate of a metal layer on the substrate 25.

The current inventors have realized that adding a CO gas to the ruthenium carbonyl precursor vapor can reduce the above-mentioned problems that limit the delivery of the ruthenium carbonyl precursor to the substrate. Thus, according to an embodiment of the invention, the CO gas is added to the ruthenium carbonyl precursor vapor to reduce dissociation of the ruthenium carbonyl precursor vapor in the gas line, thereby shifting the equilibrium in Equation (1) to the left and reducing premature decomposition of the ruthenium carbonyl precursor in the vapor precursor delivery system 40 prior to delivery of the ruthenium carbonyl precursor to the process chamber 10. The inventors believe that addition of the CO gas to the ruthenium carbonyl precursor vapor allows for increasing the vaporization temperature from approximately 40° C. to approximately 100° C., or higher. The elevated temperature increases the vapor pressure of the ruthenium carbonyl precursor, resulting in increased delivery of the ruthenium carbonyl precursor to the process chamber and, hence, increased deposition rate of the metal on the substrate 25. Furthermore, the inventors have visually observed that flowing a mixture of Ar and the CO gas over or through the ruthenium carbonyl precursor reduces premature decomposition of the ruthenium carbonyl precursor.

According to an embodiment of the invention, the addition of CO gas to a $Ru_3(CO)_{12}$ precursor vapor allows for maintaining the $Ru_3(CO)_{12}$ precursor vaporization temperature from approximately 40° C. to approximately 150° C. Alternately, the vaporization temperature can be maintained at approximately 60° C. to approximately 90° C.

Since the addition of the CO gas to the ruthenium carbonyl precursor vapor increases the thermal stability of the ruthenium carbonyl precursor vapor, the relative concentration of the ruthenium carbonyl precursor vapor to the CO gas in the process gas can be utilized to control the decomposition rate of the ruthenium carbonyl precursor on the substrate 25 at a certain substrate temperature. Furthermore, the substrate temperature can be utilized to control the decomposition rate (and thereby the deposition rate) of the metal on the substrate 25. As those skilled in the art will readily appreciate, the amount of CO gas and the substrate temperature can easily be varied to allow for a desired vaporization temperature of the ruthenium carbonyl precursor and for achieving a desired deposition rate of the ruthenium carbonyl precursor on the substrate 25.

Furthermore, the amount of CO gas in the process gas can be selected so that ruthenium metal deposition on the substrate 25 from a ruthenium carbonyl precursor occurs in a kinetic-limited temperature regime. For example, the amount of CO gas in the process gas can be increased until the ruthenium metal deposition process is observed to occur in a kinetic-limited temperature regime. A kinetic-limited temperature regime refers to the range of deposition conditions where the deposition rate of a chemical vapor deposition process is limited by the kinetics of the chemical reactions at the substrate surface, typically characterized by a strong dependence of deposition rate on temperature. Unlike the kinetic-limited temperature regime, a mass-transfer limited regime is normally observed at higher substrate temperatures and includes a range of deposition conditions where the deposition rate is limited by the flux of chemical reactants to the substrate surface. A mass-transfer limited regime is characterized by a strong dependence of deposition rate on ruthenium carbonyl precursor flow rate and is independent of deposition temperature. Metal deposition in the kinetic-limited regime normally results in good step coverage and good conformality of the ruthenium metal layer on patterned substrates. Conformality is commonly defined as the thinnest part of the metal layer on the sidewall of a feature on the patterned substrate divided by the thickest part of the metal layer on the sidewall. Step coverage is commonly defined as the metal layer thickness on sidewall divided by the metal layer thickness away from the feature.

Still referring the FIG. 1, the deposition system 1 can further include a control system 80 configured to operate and control the operation of the deposition system 1. The control system 80 is coupled to the process chamber 10, the substrate holder 20, the substrate temperature control system 22, the chamber temperature control system 12, the vapor distribution system 30, the vapor precursor delivery system 40, the metal precursor vaporization system 50, and the gas supply system 60.

Figure 2:
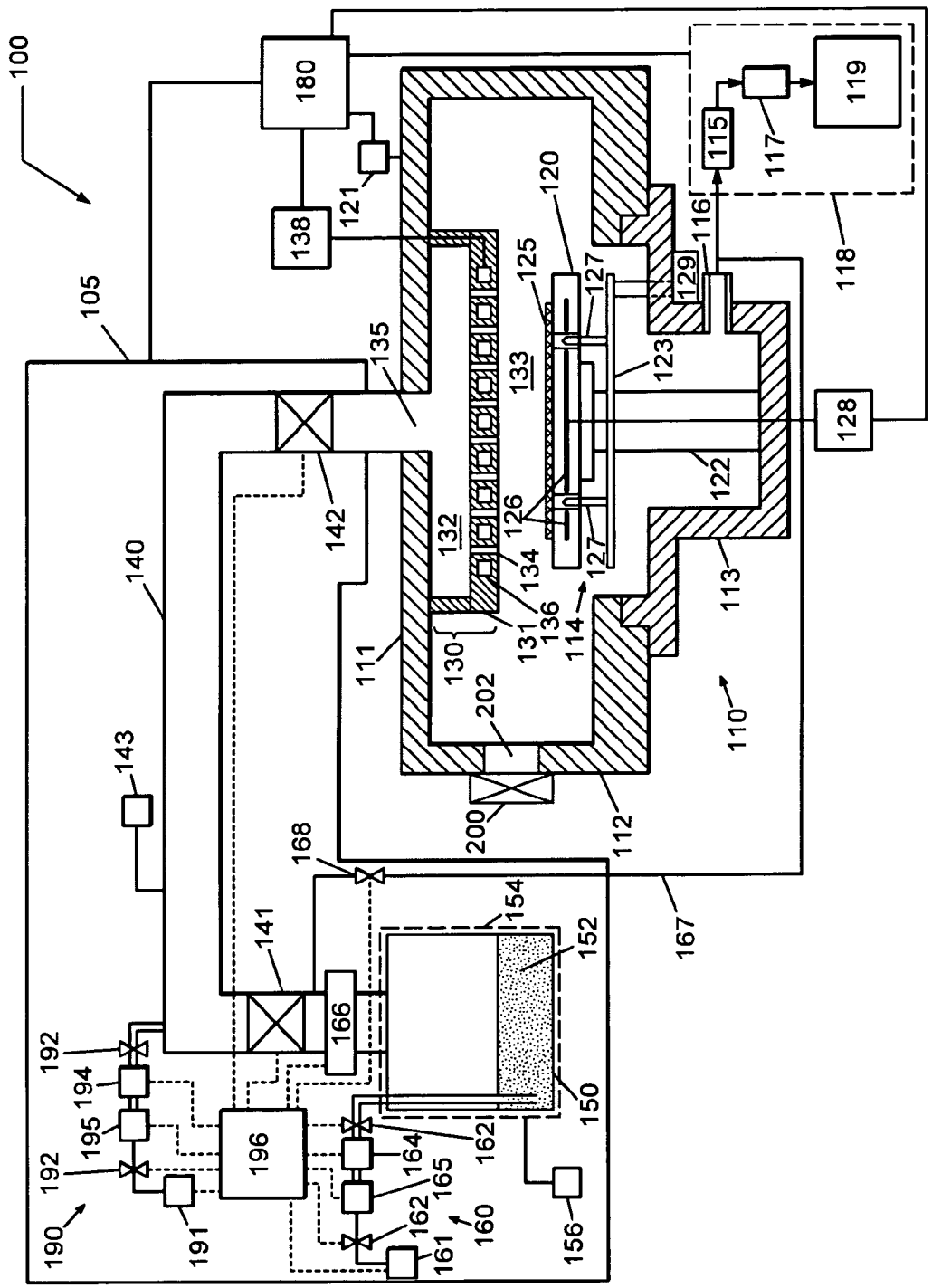
FIG. 2 depicts a schematic view of a deposition system according to another embodiment of the invention.

In another embodiment, FIG. 2 illustrates a deposition system 100 for depositing a metal layer, such as a ruthenium metal layer, on a substrate. The deposition system 100 comprises a process chamber having a substrate holder 120 configured to support a substrate 125 upon which the metal layer is formed. The process chamber 110 is coupled to a precursor delivery system 105 having metal precursor vaporization system 150 configured to store and vaporize a ruthenium carbonyl precursor 152, and a vapor precursor delivery system 140 configured to transport the vapor of the ruthenium carbonyl precursor 152 to the process chamber 110.

The process chamber 110 comprises an upper chamber section 111, a lower chamber section 112, and an exhaust chamber 113. An opening 114 is formed within lower chamber section 112, where bottom section 112 couples with exhaust chamber 113.

Still referring to FIG. 2, substrate holder 120 provides a horizontal surface to support substrate (or wafer) 125, which is to be processed. The substrate holder 120 can be supported by a cylindrical support member 122, which extends upward from the lower portion of exhaust chamber 113. Furthermore, the substrate holder 120 comprises a heater 126 coupled to substrate holder temperature control system 128. The heater 126 can, for example, include one or more resistive heating elements. Alternately, the heater 126 can, for example, include a radiant heating system, such as a tungsten-halogen lamp. The substrate holder temperature control system 128 can include a power source for providing power to the one or more heating elements, one or more temperature sensors for measuring the substrate temperature or the substrate holder temperature, or both, and a controller configured to perform at least one of monitoring, adjusting, or controlling the temperature of the substrate 125 or substrate holder 120.

During processing, the heated substrate 125 can thermally decompose the ruthenium carbonyl precursor vapor, and enable deposition of a metal layer on the substrate 125. According to an embodiment, the ruthenium carbonyl precursor 152 can be $Ru_3(CO)_{12}$. As will be appreciated by those skilled in the art of thermal chemical vapor deposition, other ruthenium carbonyl precursors can be used without departing from the scope of the invention. The substrate holder 120 is heated to a pre-determined temperature that is suitable for depositing the desired Ru metal layer or other metal layer onto the substrate 125. Additionally, a heater (not shown) coupled to a chamber temperature control system 121 can be embedded in the walls of process chamber 110 to heat the chamber walls to a pre-determined temperature. The heater can maintain the temperature of the walls of process chamber 110 from about 40° C. to about 150° C., or from about 40° C. to about 80° C. A pressure gauge (not shown) is used to measure the process chamber pressure. According to an embodiment of the invention, the process chamber pressure can be between about 1 mTorr and about 200 mTorr. Alternately, the process chamber pressure can be between about 5 mTorr and about 50 mTorr.

Also shown in FIG. 2, a vapor distribution system 130 is coupled to the upper chamber section 111 of process chamber 110. Vapor distribution system 130 comprises a vapor distribution plate 131 configured to introduce precursor vapor from vapor distribution plenum 132 to a processing zone 133 above substrate 125 through one or more orifices 134.

Furthermore, an opening 135 is provided in the upper chamber section 111 for introducing a ruthenium carbonyl precursor vapor from vapor precursor delivery system 140 into vapor distribution plenum 132. Moreover, temperature control elements 136, such as concentric fluid channels configured to flow a cooled or heated fluid, are provided for controlling the temperature of the vapor distribution system 130, and thereby prevent the decomposition or condensation of the ruthenium carbonyl precursor inside the vapor distribution system 130. For instance, a fluid, such as water, can be supplied to the fluid channels from a vapor distribution temperature control system 138. The vapor distribution temperature control system 138 can include a fluid source, a heat exchanger, one or more temperature sensors for measuring the fluid temperature or vapor distribution plate temperature or both, and a controller configured to control the temperature of the vapor distribution plate 131 from about 20° C. to about 150° C.

As illustrated in FIG. 2, a metal precursor vaporization system 150 is configured to hold a ruthenium carbonyl precursor 152 and evaporate (or sublime) the ruthenium carbonyl precursor 152 by elevating the temperature of the ruthenium carbonyl precursor. The terms "vaporization," "sublimation" and "evaporation" are used interchangeably herein to refer to the general formation of a vapor (gas) from a solid or liquid precursor, regardless of whether the transformation is, for example, from solid to liquid to gas, solid to gas, or liquid to gas. A precursor heater 154 is provided for heating the ruthenium carbonyl precursor 152 to maintain the ruthenium carbonyl precursor 152 at a temperature that produces a desired vapor pressure of ruthenium carbonyl precursor 152. The precursor heater 154 is coupled to a vaporization temperature control system 156 configured to control the temperature of the ruthenium carbonyl precursor 152. For example, the precursor heater 154 can be configured to adjust the temperature of the ruthenium carbonyl precursor 152 from about 40° C. to about 150° C., or from about 60° C. to about 90° C.

As the ruthenium carbonyl precursor 152 is heated to cause evaporation (or sublimation), a CO-containing gas can be passed over or through the ruthenium carbonyl precursor 152, or any combination thereof. The CO-containing gas can contain CO and an inert gas, such as $N_2$ or a noble gas (i.e., He, Ne, Ar, Kr, Xe). Alternately, other embodiments contemplate omitting an inert gas. According to an embodiment of the invention, a CO gas can be added to the inert gas. Alternately, other embodiments contemplate the CO gas replacing the inert gas. For example, a gas supply system 160 is coupled to the metal precursor vaporization system 150, and it is configured to, for instance, flow the CO gas, the inert gas, or both, over or through the ruthenium carbonyl precursor 152. Although not shown in FIG. 2, gas supply system 160 can also or alternatively be coupled to the vapor precursor delivery system 140 to supply the carrier gas and/or CO gas to the vapor of the metal precursor 152 as or after it enters the vapor precursor delivery system 140. The gas supply system 160 can comprise a gas source 161 containing a carrier gas, a CO gas, or a mixture thereof, one or more control valves 162, one or more filters 164, and a mass flow controller 165. For instance, the mass flow rate of the CO-containing gas can range from approximately 0.1 sccm to approximately 1000 sccm.

Additionally, a sensor 166 is provided for measuring the total gas flow from the metal precursor vaporization system 150. The sensor 166 can, for example, comprise a mass flow controller, and the amount of ruthenium carbonyl precursor vapor delivered to the process chamber 110 can be determined using sensor 166 and mass flow controller 165. Alternately, the sensor 166 can comprise a light absorption sensor to measure the concentration of the ruthenium carbonyl precursor vapor in the gas flow to the process chamber 110.

A bypass line 167 can be located downstream from sensor 166, and it can connect the vapor delivery system 140 to an exhaust line 116. Bypass line 167 is provided for evacuating the vapor precursor delivery system 140, and for stabilizing the supply of the ruthenium carbonyl precursor to the process chamber 110. In addition, a bypass valve 168, located downstream from the branching of the vapor precursor delivery system 140, is provided on bypass line 167.

Referring still to FIG. 2, the vapor precursor delivery system 140 comprises a high conductance vapor line having first and second valves 141 and 142, respectively. Additionally, the vapor precursor delivery system 140 can further comprise a vapor line temperature control system 143 configured to heat the vapor precursor delivery system 140 via heaters (not shown). The temperatures of the vapor lines can be controlled to avoid condensation of the ruthenium carbonyl precursor vapor in the vapor line. The temperature of the vapor lines can be controlled from about 20° C. to about 100° C., or from about 40° C. to about 90° C.

Moreover, a CO gas can be supplied from a gas supply system 190. For example, the gas supply system 190 is coupled to the vapor precursor delivery system 140, and it is configured to, for instance, mix the CO gas with the ruthenium carbonyl precursor vapor in the vapor precursor delivery system 140, for example, downstream of valve 141. The gas supply system 190 can comprise a CO gas source 191, one or more control valves 192, one or more filters 194, and a mass flow controller 195. For instance, the mass flow rate of CO gas can range from approximately 0.1 sccm (standard cubic centimeters per minute) to approximately 1000 sccm.

Mass flow controllers 165 and 195, and valves 162, 192, 168, 141, and 142 are controlled by controller 196, which controls the supply, shutoff, and the flow of the carrier gas, the CO gas, and the ruthenium carbonyl precursor vapor. Sensor 166 is also connected to controller 195 and, based on output of the sensor 166, controller 195 can control the carrier gas flow through mass flow controller 165 to obtain the desired ruthenium carbonyl precursor flow to the process chamber 110.

As illustrated in FIG. 2, the exhaust line 116 connects exhaust chamber 113 to pumping system 118. A vacuum pump 119 is used to evacuate process chamber 110 to the desired degree of vacuum, and to remove gaseous species from the process chamber 110 during processing. An automatic pressure controller (APC) 115 and a trap 117 can be used in series with the vacuum pump 119. The vacuum pump 119 can include a turbo-molecular pump (TMP) capable of a pumping speed up to 500 liters per second (and greater). Alternately, the vacuum pump 119 can include a dry roughing pump. During processing, the process gas can be introduced into the process chamber 110, and the chamber pressure can be adjusted by the APC 115. The APC 115 can comprise a butterfly-type valve or a gate valve. The trap 117 can collect unreacted ruthenium carbonyl precursor material and by-products from the process chamber 110.

Referring back to the substrate holder 120 in the process chamber 110, as shown in FIG. 2, three substrate lift pins 127 (only two are shown) are provided for holding, raising, and lowering the substrate 125. The substrate lift pins 127 are coupled to plate 123, and can be lowered to below the upper surface of substrate holder 120. A drive mechanism 129 utilizing, for example, an air cylinder provides means for raising and lowering the plate 123. Substrate 125 can be transferred into and out of process chamber 110 through gate valve 200 and chamber feed-through passage 202 via a robotic transfer system (not shown), and received by the substrate lift pins 127. Once the substrate 125 is received from the transfer system, it can be lowered to the upper surface of the substrate holder 120 by lowering the substrate lift pins 127.

Still referring to FIG. 2, a controller 180 includes a microprocessor, a memory, and a digital I/O port capable of generating control voltages sufficient to communicate and activate inputs of the deposition system 100 as well as monitor outputs from the deposition system 100. Moreover, the deposition system controller 180 is coupled to and exchanges information with process chamber 110; precursor delivery system 105, which includes controller 196, vapor line temperature control system 143, and vaporization temperature control system 156; vapor distribution temperature control system 138; vacuum pumping system 118; and substrate temperature control system 128. In the vacuum pumping system 118, the controller 180 is coupled to and exchanges information with the automatic pressure controller 115 for controlling the pressure in the process chamber 110. A program stored in the memory is utilized to control the aforementioned components of deposition system 100 according to a stored process recipe. One example of deposition system controller 180 is a DELL PRECISION WORKSTATION 610™, available from Dell Corporation, Dallas, Tex.

The controller 180 may be implemented as a general-purpose computer system that performs a portion or all of the microprocessor-based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 180 includes at least one computer readable medium or memory, such as the controller memory, for holding instructions programmed according to the teachings of the invention and for containing data structures, tables, records, or other data that may be necessary to implement the present invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, the present invention includes software for controlling the controller 180, for driving a device or devices for implementing the invention, and/or for enabling the controller to interact with a human user. Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor of the controller 180 for execution. A computer readable medium may take many forms, including but not limited to, non-volatile media, volatile media, and transmission media. Non-volatile media includes, for example, optical disks, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to the processor of the controller for execution. For example, the instructions may initially be carried on a magnetic disk of a remote computer. The remote computer can load the instructions for implementing all or a portion of the present invention remotely into a dynamic memory and send the instructions over a network to the controller 180.

The controller 180 may be locally located relative to the deposition system 100, or it may be remotely located relative to the deposition system 100. For example, the controller 180 may exchange data with the deposition system 100 using at least one of a direct connection, an intranet, the Internet and a wireless connection. The controller 180 may be coupled to an intranet at, for example, a customer site (i.e., a device maker, etc.), or it may be coupled to an intranet at, for example, a vendor site (i.e., an equipment manufacturer). Additionally, for example, the controller 180 may be coupled to the Internet. Furthermore, another computer (i.e., controller, server, etc.) may access, for example, the controller 180 to exchange data via at least one of a direct connection, an intranet, and the Internet. As also would be appreciated by those skilled in the art, the controller 180 may exchange data with the deposition system 100 via a wireless connection.

Figure 3:
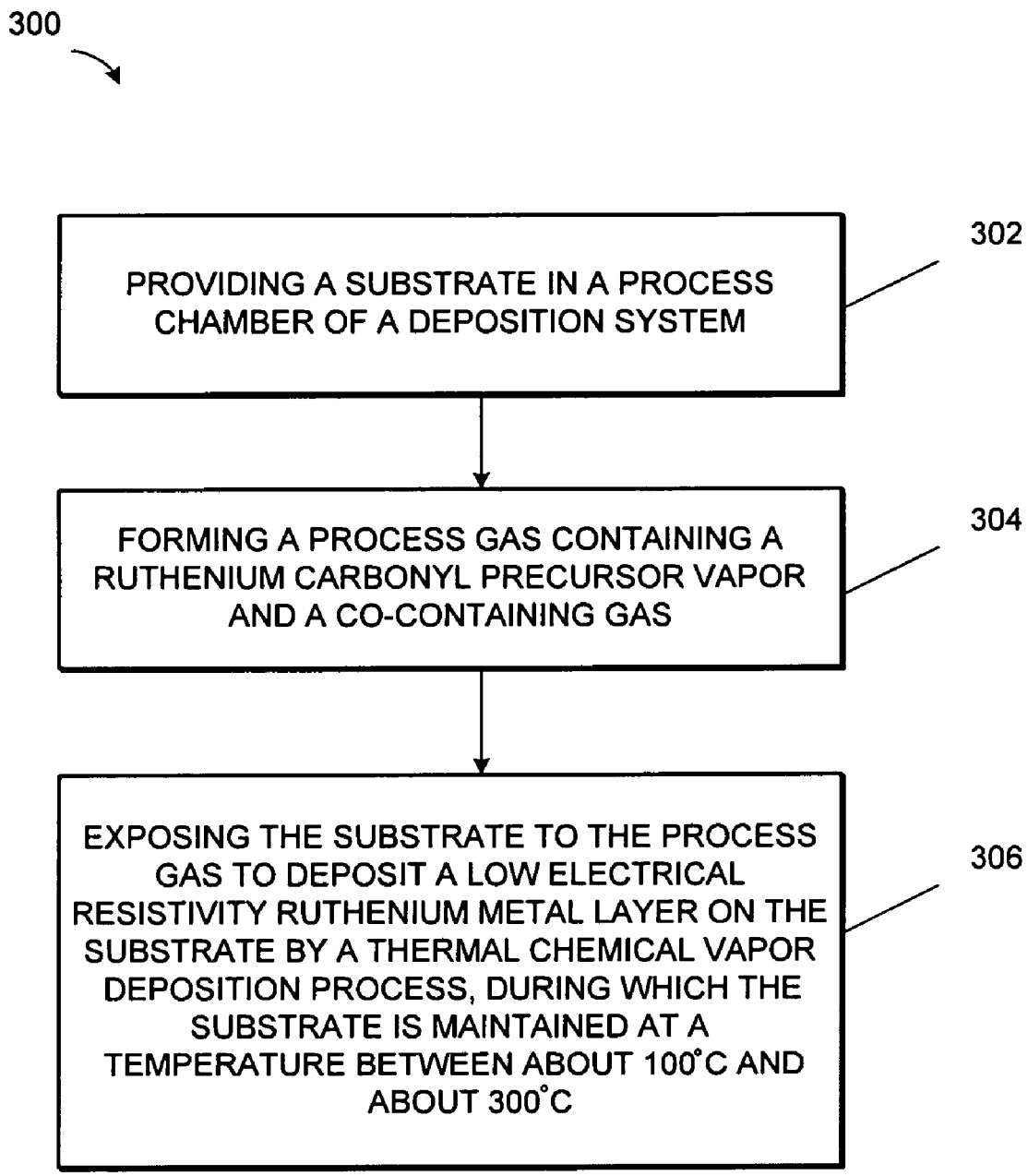
FIG. 3 illustrates a method of depositing a ruthenium metal layer on a substrate according to an embodiment of the invention.

FIG. 3 illustrates a method of depositing a ruthenium metal layer on a substrate according to an embodiment of the invention. The method 300 includes, at 302, providing a substrate in a process chamber of a deposition system. For example, the deposition system can include the depositions systems 1, 100 described above in FIGS. 1 and 2. The substrate can, for example, be a Si substrate. A Si substrate can be of n- or p-type, depending on the type of device being formed. The substrate can be of any size, for example a 200 mm substrate, a 300 mm substrate, or an even larger substrate. According to an embodiment of the invention, as further described in FIGS. 6A-6D, the substrate can be a patterned substrate containing one or more vias or trenches, or combinations thereof. At 304, a process gas containing a ruthenium carbonyl precursor vapor and a CO-containing gas is formed. The process gas can further contain an inert carrier gas such as Ar. According to one embodiment of the invention, the ruthenium carbonyl precursor can be $Ru_3(CO)_{12}$. Addition of the CO-containing gas to the ruthenium carbonyl precursor vapor allows for increasing the vaporization temperature of ruthenium carbonyl precursor. The elevated temperature increases the vapor pressure of the ruthenium carbonyl precursor, resulting in increased delivery of the ruthenium carbonyl precursor to the process chamber and, hence, increased deposition rate of the ruthenium metal on a substrate.

According to an embodiment of the invention, the process gas can be formed by heating a ruthenium carbonyl precursor to form the ruthenium carbonyl precursor vapor, and mixing the CO-containing gas with the ruthenium carbonyl precursor vapor. According to an embodiment of the invention, the CO-containing gas can be mixed with the ruthenium carbonyl precursor vapor downstream from the ruthenium carbonyl precursor. According to another embodiment of the invention, the CO-containing gas can be mixed with the ruthenium carbonyl precursor vapor by flowing the CO-containing gas over or through the ruthenium carbonyl precursor.

At 306, the substrate is exposed to the process gas to deposit a low electrical resistivity ruthenium metal layer on the substrate by a thermal chemical vapor deposition process. According to an embodiment of the invention, the ruthenium metal layer can be deposited at a substrate temperature between about 100° C. and about 300° C. Alternately, the substrate temperature can be between about 180° C. and about 250° C. According to an embodiment of the invention, the thickness of the ruthenium metal layer can be between about 10 angstroms and about 300 angstroms. Alternately, the thickness can be between about 20 angstroms and about 50 angstroms.

As would be appreciated by those skilled in the art, each of the steps or stages in the flowchart of FIG. 3 may encompass one or more separate steps and/or operations. Accordingly, the recitation of only three steps in 302, 304, 306 should not be understood to limit the method of the present invention solely to three steps or stages. Moreover, each representative step or stage 302, 304, 306 should not be understood to be limited to only a single process.

Figure 4:
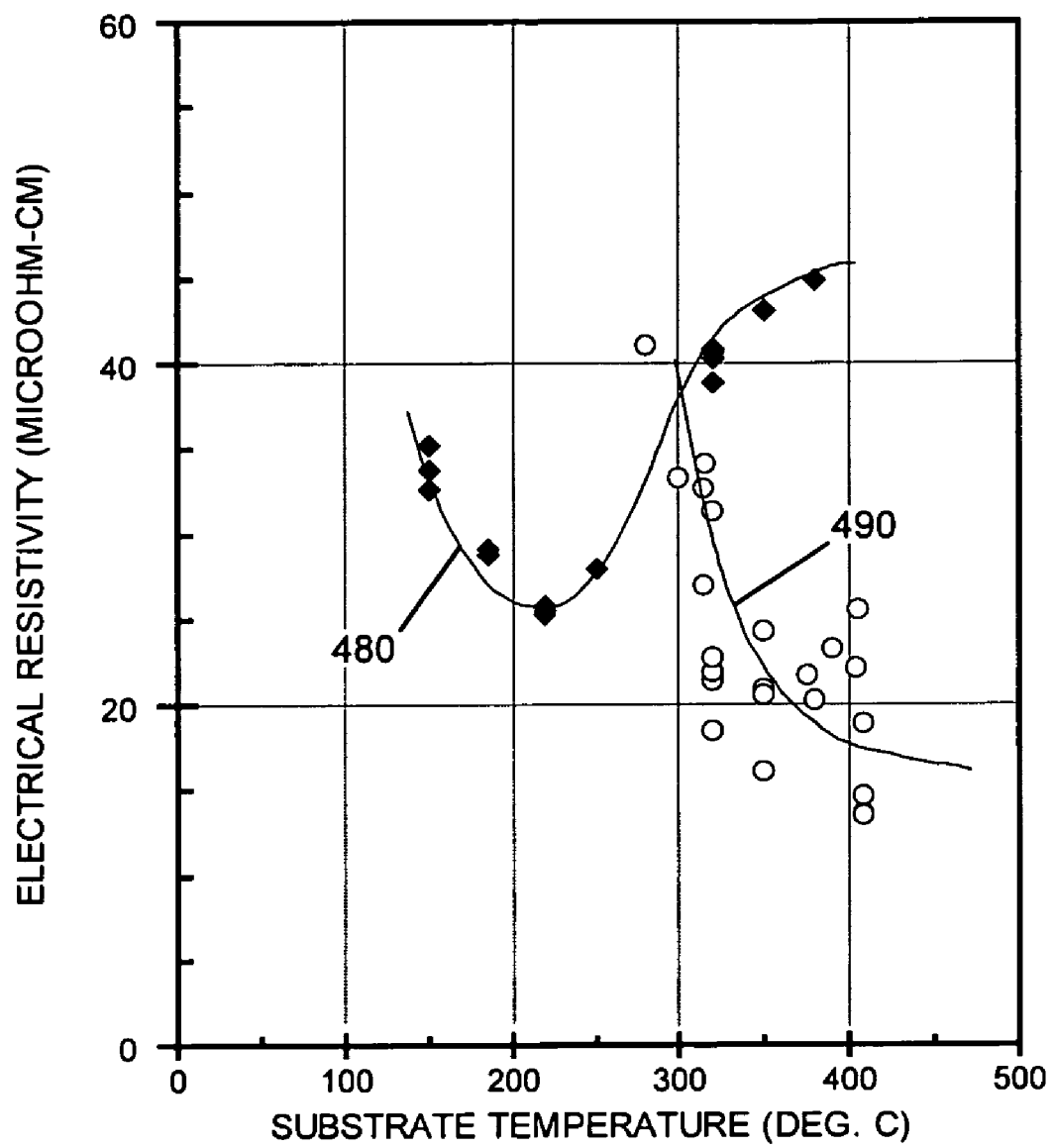
FIG. 4 shows electrical resistivity of ruthenium metal layers as a function of substrate temperature according to an embodiment of the invention.

FIG. 4 shows electrical resistivity of ruthenium metal layers as a function of substrate temperature according to an embodiment of the invention. Trace 480 shows electrical resistivity of deposited ruthenium metal layers as a function of substrate temperature using a process gas containing $Ru_3(CO)_{12}$, Ar, and CO, where the CO+Ar carrier gas was flowed through the solid $Ru_3(CO)_{12}$ precursor. As seen by the trace 480, the electrical resistivity of the ruthenium metal layers decreases from about 40 microohm-cm at about 300° C. to about 25 microohm-cm at about 220° C. and increases to about 35 microohm-cm at about 150° C. When compared to the bulk ruthenium resistivity of 7.1 microohm-cm, these electrical resistivity values are reasonable for integration of ruthenium metal layers into semiconductor devices.

The electrical resistivity results depicted by trace 480 in FIG. 4 unexpectedly show a minimum in the electrical resistivity around 220° C. It is known that contaminants in metal films commonly increase the electrical resistivity of the metal films. Secondary ion mass spectroscopy (SIMS) of the ruthenium metal layers showed that the layers deposited around 220° C. contained significantly lower amounts of carbon and oxygen contaminants than layers deposited at higher temperatures. As for temperatures below about 220° C., the inventors speculate that CO cannot fully desorb from the deposited layer at those temperatures and CO gets incorporated into the layer, thereby increasing the electrical resistivity of the layer. This can be supported by thermal desorption studies of CO from a Ru(001) substrate, where CO gas, adsorbed onto the substrate at very low temperatures, desorbs from the substrate at temperatures between about 25 and about 225° C. In other words, if a Ru(001) substrate is maintained at a temperature around 220° C., little or no CO will stay adsorbed on the substrate.

The thickness of the ruthenium metal layers in trace 480 was about 100 angstroms, the deposition rate was between about 6 angstroms/min and about 9 angstroms/min, and the temperature of the $Ru_3(CO)_{12}$ precursor was 80° C. However, the inventors believe that the deposition rate can be increased to about 30 angstroms/min, or higher, by using a higher conductance vapor precursor delivery system (see FIGS. 1 and 2). In the trace 480, the deposition conditions further included a process chamber pressure of 15 mTorr, Ar flow of 50 sccm, and CO flow of 300 sccm. These conditions correspond to a CO partial pressure of 13 mTorr in the process chamber. For comparison, trace 490 shows the electrical resistivity of deposited ruthenium metal layers as a function of substrate temperature for a process gas containing $Ru_3(CO)_{12}$ and Ar.

In FIG. 4, comparison of the traces 480 and 490 shows that the electrical resistivity of the ruthenium metal layers is lowered in trace 480 by lowering the substrate temperature to below about 300° C. which is opposite to the trend observed in trace 490 where no CO gas was used. Importantly, the result shown in trace 480 demonstrate that low electrical resistivity ruthenium metal layers can be deposited in a thermal CVD process at substrate temperatures between about 150° C. and about 300° C. using a process gas containing $RU_3(CO)_{12}$ and CO (and inert Ar gas). Furthermore, the inventors believe that the ruthenium metal layers can be deposited at substrate temperatures as low as about 100° C. One implication of the unexpected results in FIG. 4 is the possibility of depositing and integrating ruthenium metal layers with temperature sensitive material layers such as various low-k materials. As described below in reference to FIG. 6, ruthenium metal layers can be used as barrier layers, seed layers, or both, for copper metallization applications.

Figure 5:
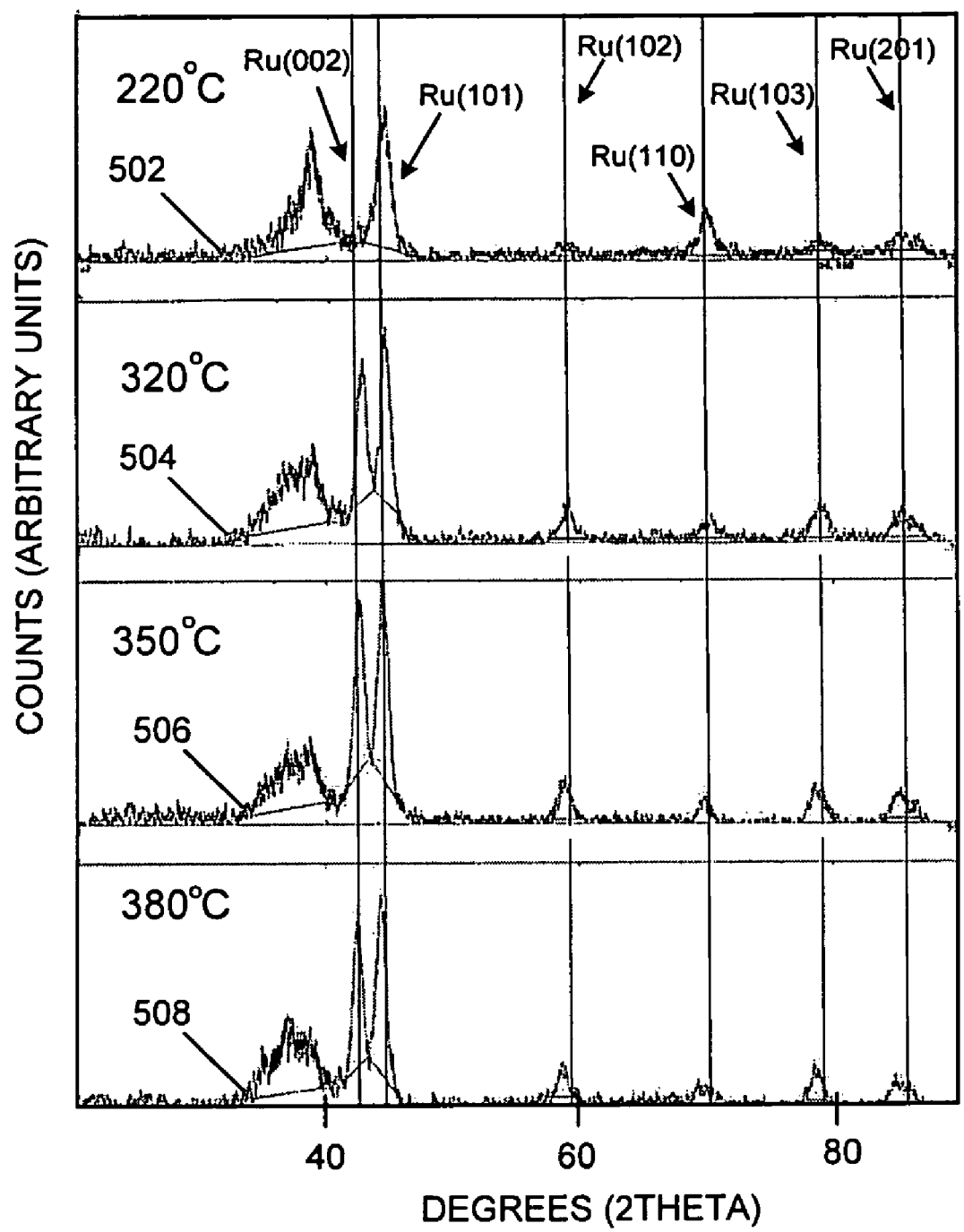
FIG. 5 shows XRD patterns of ruthenium metal layers formed according to embodiments of the invention.

FIG. 5 shows X-ray diffraction (XRD) patterns of ruthenium metal layers formed according to embodiments of the invention. The crystallographic orientations of the deposited ruthenium metal layers were measured using XRD, and for the process conditions studied, all the diffraction lines could be assigned to ruthenium metal layers and the underlying Si substrate. In particular, XRD intensities at 42.3 degrees corresponding to the Ru(002) crystallographic orientation, and XRD intensities at 44.1 degrees corresponding to the Ru(101) crystallographic orientation were measured. In addition, as shown in FIG. 5, XRD features corresponding to Ru(102), Ru(110), Ru(103), and Ru(201) crystallographic orientations were observed. For a hexagonal close-packed (hcp) structure such as Ru metal, the most thermodynamically stable orientation is the Ru(002).

Trace 502 in FIG. 5, which corresponds to a low electrical resistivity ruthenium metal layer deposited at a substrate temperature of 220° C., shows a XRD pattern characterized by strong intensity corresponding to Ru(101) but a very weak intensity corresponding to Ru(002). Traces 504, 506, and 508 in FIG. 5, which correspond to high electrical resistivity ruthenium metal layers deposited at substrate temperatures of 320° C., 350° C., and 380° C., respectively, show XRD patterns that are characterized by comparable Ru(002) and Ru(101) intensities. The Ru(002)/Ru(101) ratios are ~0, 0.77, 0.83, and 0.83, for substrate temperatures of 220° C., 320° C., 350° C., and 380° C., respectively. For comparison, high electrical resistivity ruthenium metal layers deposited at substrate temperature of 320° C. using $Ru_3(CO)_{12}$ and Ar (but no CO gas) also showed comparable Ru(002) and Ru(101) intensities as the traces 504, 506, and 508.

Visual inspection of scanning electron micrographs (SEM) taken of ruthenium metal layers deposited using a process gas containing $Ru_3(CO)_{12}$, CO, and Ar gas, at substrate temperatures of 320° C. and greater, showed well-defined grains with grain sizes of about 5-10 nm. Furthermore, SEMs of ruthenium metal layers deposited at a substrate temperature of 220° C. did not show well-defined grains. For comparison, SEMs taken of ruthenium metal layers deposited using a process gas containing $Ru_3(CO)_{12}$ and Ar gas, at a substrate temperatures of 320° C., showed well defined grains with grain sizes between about 20-40 nm.

It has been proposed that a diffusion barrier layer with small grain sizes is needed for copper metallization because a highly-crystalline thin diffusion barrier layer can provide diffusion paths for easy migration of copper metal through the diffusion barrier layer to the underlying dielectric layer or substrate. Thus, thin ruthenium metal layers were deposited onto a Si substrate (200 mm wafer) according to embodiments of the invention and tested as diffusion layers for copper metallization. The ruthenium layers were 2.5, 5, and 10 nm thick and were deposited at substrate temperatures of 150° C. and 220° C. Next, copper was deposited onto the ruthenium metal layers by ionized physical vapor deposition (IPVD). Next, the substrates were annealed for 30 min at 400° C. in a $N_2$ atmosphere. The ruthenium barrier properties were evaluated by measuring the sheet resistance of the substrates following the anneal. The sheet resistance measurements showed that all the ruthenium layers deposited at 150° C. had good barrier properties, whereas only the 5 nm and 10 nm thick ruthenium layers deposited at 220° C. showed good barrier properties, similar to those observed for a IPVD-TaN/Ta (5 nm/5 nm) reference barrier commonly used for copper metallization.

The above results show that a ruthenium metal layer deposited at low substrate temperature using CO gas has a low Ru(002)/Ru(101) ratio and exhibits good barrier properties. This is opposite to what is observed for ruthenium metal layers deposited with or without CO gas at substrate temperatures above about 300° C.

Figure 6A:
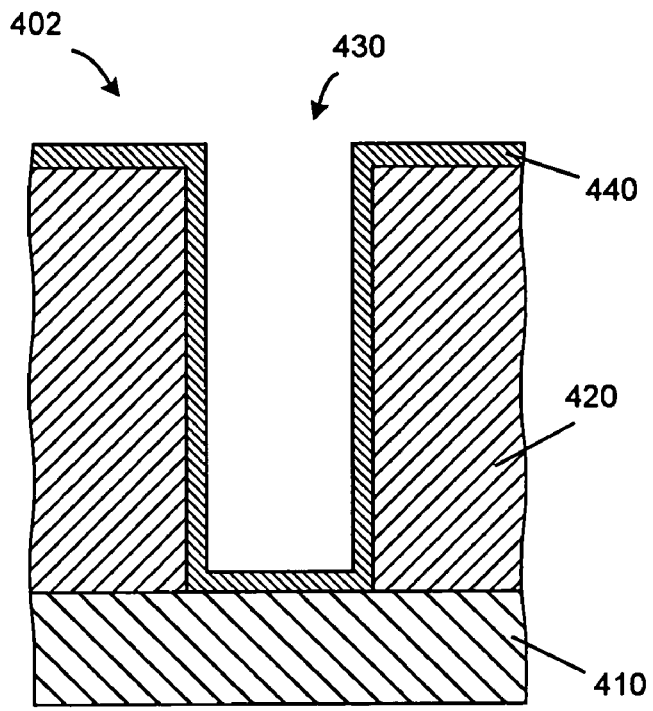
FIGS. 6A-6D schematically show formation of a ruthenium metal layer on a patterned substrate according to embodiments of the invention.

FIGS. 6A-6D schematically show formation of a ruthenium metal layer on a patterned substrate according to embodiments of the invention. As those skilled in the art will readily appreciate, embodiments of the invention can be applied to patterned substrates containing one or more vias or trenches, or combinations thereof. FIG. 6A schematically shows deposition of a ruthenium metal layer 440 onto a patterned structure 402 according to an embodiment of the invention. The patterned structure 402 contains a first metal layer 410, and a patterned layer 420 containing an opening 430. The patterned layer 420 can, for example, be a dielectric material. The opening 430 can, for example, be a via or a trench. The structure 402 further contains a ruthenium metal layer 440 deposited onto the patterned layer 420 and the first metal layer 410 within opening 430.

Figure 6B:
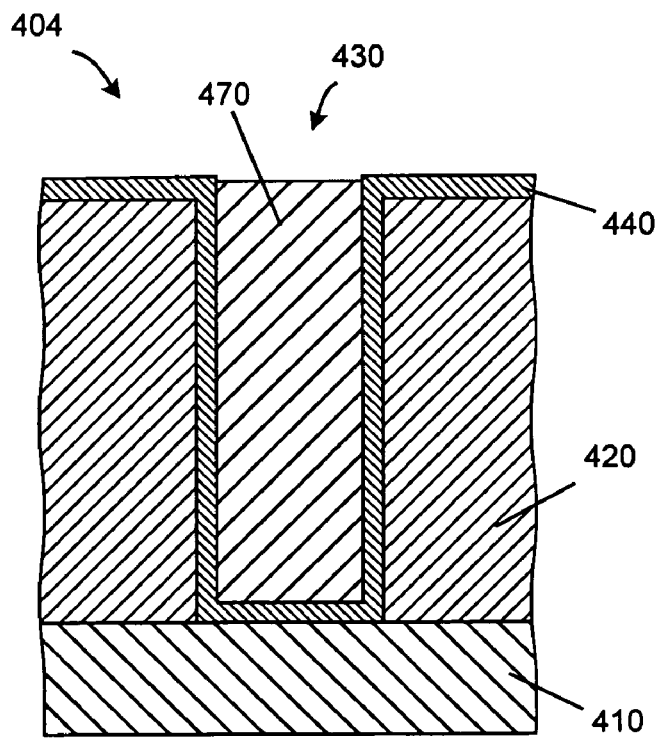

FIG. 6B schematically shows a patterned structure 404 containing a Cu layer 470 deposited in the opening 430 of FIG. 6A. The Cu layer 470 can, for example, be deposited by a Cu plating process over the entire structure 404, followed by chemical mechanical processing to planarize and remove Cu from areas away from the opening 430. According to the embodiment shown in FIGS. 6A and 6B, the ruthenium metal layer 440 can be a barrier layer and a seed layer for subsequent Cu deposition onto the ruthenium metal layer 440.

Figure 6C:
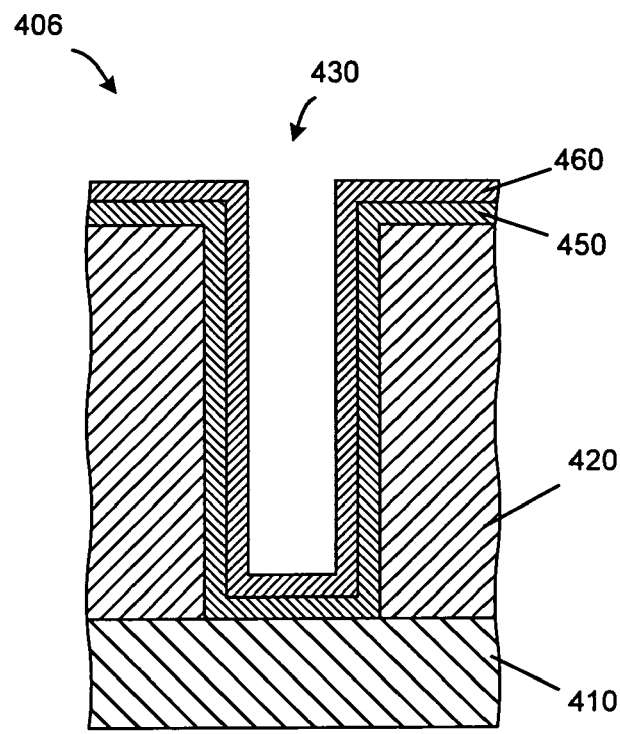

FIG. 6C schematically shows deposition of a ruthenium metal layer 460 onto a patterned structure 406 according to another embodiment of the invention. The patterned structure 406 contains a first metal layer 410 and a patterned layer 420 containing an opening 430. A barrier layer 450 is deposited onto the patterned structure 406, and a ruthenium metal layer 460 is deposited on the barrier layer 450. The barrier layer 450 can, for example, contain a tantalum-containing material (e.g., Ta, TaN, or TaCN, or a combination of two or more thereof) or a tungsten material (e.g., W or WN). The patterned layer 420 can, for example, be a dielectric material. The opening 430 can, for example, be a via or a trench.

In one example, a ruthenium metal layer 460 was deposited at a temperature of 150° C. onto a patterned structure 406 containing an opening 430 that was about 140 nm wide and about 420 nm deep (aspect ratio ~3). The step coverage was greater than 80%. The barrier layer 450 contained TaN (2.5 nm) and Ta (4 nm). The process chamber pressure was 15 mTorr, CO flow was 300 sccm and Ar flow was 50 sccm.

Figure 6D:
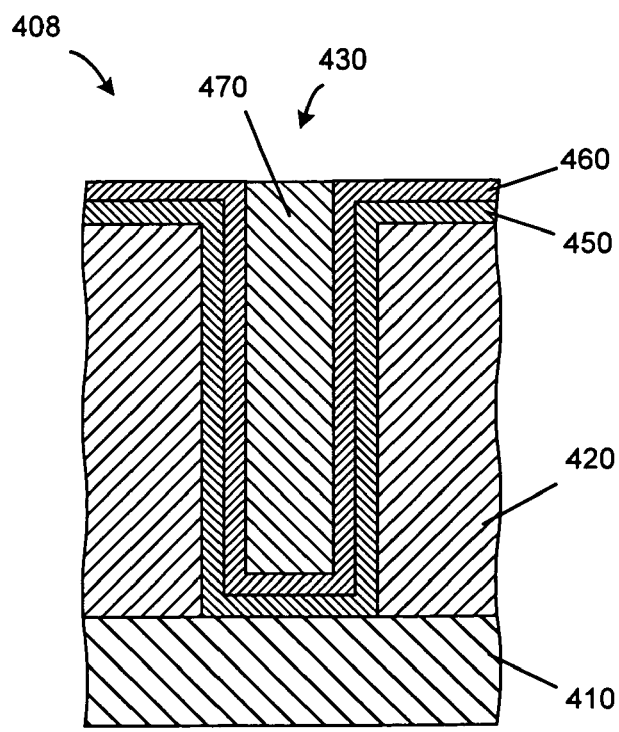

FIG. 6D schematically shows deposition of Cu layer 470 in the opening 430. The Cu layer 470 can, for example, be deposited as described above in reference to FIG. 6B. According to the embodiment shown in FIGS. 6C and 6D, the ruthenium metal layer 460 can be a seed layer for subsequent Cu deposition onto the ruthenium metal layer 460.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A low-temperature method of depositing a ruthenium metal layer on a substrate, the method comprising:
   providing a substrate in a process chamber of a deposition system;
   forming a process gas containing $Ru_3(CO)_{12}$ precursor vapor and a CO-containing gas and delivering the process gas to the process chamber; and
   exposing the substrate to the process gas to deposit a low electrical resistivity ruthenium metal layer on the substrate by a thermal chemical vapor deposition process, wherein the substrate is maintained at a temperature between about 100° C. and about 300° C. during the exposing, and wherein the electrical resistivity of the ruthenium metal layer is between about 8 microohm-cm and about 40 microohm-cm.

2. The method according to claim 1, wherein the exposing comprises maintaining the substrate at a temperature between about 180° C. and about 250° C.

3. The method according to claim 1, wherein electrical resistivity of the ruthenium metal layer is between about 20 microohm-cm about 30 microohm-cm.

4. The method according to claim 1, wherein the exposing is sufficient to deposit the ruthenium metal layer to a thickness between about 10 angstroms and about 300 angstroms.

5. The method according to claim 1, wherein the exposing is sufficient to deposit the ruthenium metal layer to a thickness between about 20 angstroms and about 50 angstroms.

6. The method according to claim 1, wherein the forming comprises:
heating $Ru_3(CO)_{12}$ precursor to form the $Ru_3(CO)_{12}$ precursor vapor; and
mixing the CO-containing gas with the $Ru_3(CO)_{12}$ precursor vapor.

7. The method according to claim 6, wherein the heating comprises:
maintaining the $Ru_3(CO)_{12}$ precursor at a temperature between about 40° C. and about 150° C.

8. The method according to claim 6, wherein the heating comprises:
maintaining the $Ru_3(CO)_{12}$ precursor at a temperature between about 60° C. and about 90° C.

9. The method according to claim 6, wherein the mixing comprises:
mixing the CO-containing gas with the $Ru_3(CO)_{12}$ precursor vapor downstream from the $Ru_3(CO)_{12}$ precursor.

10. The method according to claim 6, wherein the mixing comprises:
flowing the CO-containing gas over or through the $Ru_3(CO)_{12}$ precursor.

11. The method according to claim 10, wherein a flow of the CO-containing gas is between about 0.1 sccm and about 1000 sccm.

12. The method according to claim 10, wherein a flow of the CO-containing gas is between about 10 sccm and about 300 sccm.

13. The method according to claim 1, wherein the CO-containing gas comprises CO and an inert gas.

14. The method according to claim 1, further comprising maintaining the process chamber at a pressure between about 1 mTorr and about 200 mTorr during the exposing.

15. The method according to claim 1, further comprising maintaining the process chamber at a pressure between about 5 mTorr and about 50 mTorr during the exposing.

16. The method according to claim 1, wherein the substrate is a patterned substrate containing one or more vias or trenches, or combinations thereof.

17. A low-temperature method of depositing a ruthenium metal layer on a substrate, the method comprising:
providing a substrate in a process chamber of a deposition system;
forming a process gas containing $Ru_3(CO)_{12}$ precursor vapor and a CO-containing gas and delivering the process gas to the process chamber; and
exposing the substrate to the process gas to deposit a low electrical resistivity ruthenium metal layer on the substrate by a thermal chemical vapor deposition process, wherein the exposing is conducted at a substrate temperature in the range of about 100° C. to about 300° C. that results in the ruthenium metal layer having predominantly Ru(101) crystallographic orientation.

18. A low-temperature method of depositing a ruthenium metal layer on a substrate, the method comprising:
providing a substrate in a process chamber of a deposition system;
forming a process gas containing $Ru_3(CO)_{12}$ precursor vapor and a CO-containing gas and delivering the process gas to the process chamber; and
exposing the substrate to the process gas to deposit on the substrate a low electrical resistivity ruthenium metal layer having predominantly Ru(101) crystallographic orientation by a thermal chemical vapor deposition process, wherein the substrate is maintained at a temperature between about 180° C. and about 250° C. during the exposing.

19. The method according to claim 18, wherein the electrical resistivity of the ruthenium metal layer is between about 20 microohm-cm about 30microohm-cm.

20. The method according to claim 18, wherein the exposing is sufficient to deposit the ruthenium metal layer to a thickness between about 10 angstroms and about 300 angstroms.

21. The method according to claim 18, wherein the forming comprises:
flowing the CO-containing gas over or through a solid $Ru_3(CO)_{12}$ precursor while heating the solid $Ru_3(CO)_{12}$ precursor to form the $Ru_3(CO)_{12}$ precursor vapor.

22. The method according to claim 21, wherein the heating comprises:
maintaining the $Ru_3(CO)_{12}$ precursor at a temperature between about 40° C. and about 150° C.

23. The method according to claim 21, wherein the flow of the CO-containing gas is between about 0.1 sccm and about 1000 sccm.

* * * * *